United States Patent
Tang

(10) Patent No.: US 6,778,433 B1
(45) Date of Patent: Aug. 17, 2004

(54) HIGH PROGRAMMING EFFICIENCY MRAM CELL STRUCTURE

(75) Inventor: Denny Tang, Saratoga, CA (US)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 117 days.

(21) Appl. No.: 10/163,845

(22) Filed: Jun. 6, 2002

(51) Int. Cl.$^7$ .............................................. G11C 11/15
(52) U.S. Cl. ..................... 365/173; 365/158; 365/171
(58) Field of Search ................................ 365/173, 158, 365/213, 232, 171

(56) References Cited

U.S. PATENT DOCUMENTS

| | | | |
|---|---|---|---|
| 5,902,690 A | 5/1999 | Tracy et al. ................ 428/693 |
| 5,978,257 A | 11/1999 | Zhu et al. ................... 365/173 |
| 6,163,477 A | 12/2000 | Tran ........................... 365/173 |
| 6,165,803 A | 12/2000 | Chen et al. ..................... 438/3 |
| 6,174,737 B1 | 1/2001 | Durlam et al. ................. 438/3 |
| 6,211,090 B1 | 4/2001 | Durlam et al. .............. 438/692 |
| 6,269,018 B1 * | 7/2001 | Monsma et al. ............ 365/145 |
| 6,272,040 B1 | 8/2001 | Salter et al. ................. 365/158 |
| 6,556,473 B2 * | 4/2003 | Saito et al. .................. 365/158 |
| 6,606,263 B1 * | 8/2003 | Tang .......................... 365/158 |
| 6,642,595 B1 * | 11/2003 | Hung et al. ................. 257/421 |
| 6,711,053 B1 * | 3/2004 | Tang .......................... 365/158 |

* cited by examiner

*Primary Examiner*—Van Thu Nguyen
*Assistant Examiner*—Hien Nguyen
(74) *Attorney, Agent, or Firm*—George O. Saile; Stephen B. Ackerman

(57) ABSTRACT

Currently it takes up to 10 mA current in the programming line to switch a cell in an MRAM. This current is high enough to cause electro-migration problems over the life of an array so there is a need for a more efficient way to generate the programming field. The present invention solves this problem by (1) passing the programming current inside the cell, i.e, through the pinned layer, and (2) surrounding each program line with a sheath of high permeability material which covers the wire except for a gap located directly above or below the memory element. This high permeability layer may be a conductor or an insulator, the latter case allowing it to make direct contact with the memory element.

34 Claims, 4 Drawing Sheets

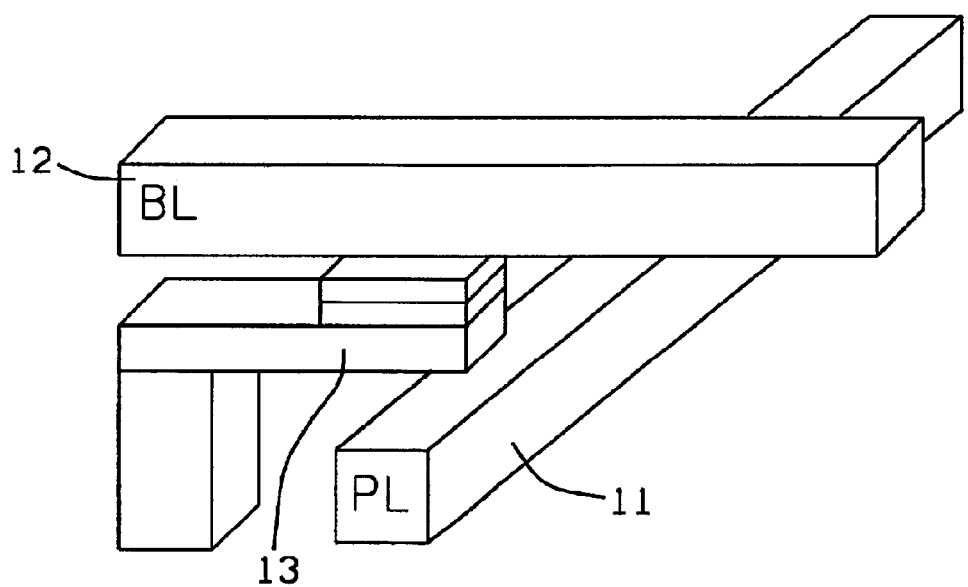
*FIG. 1 - Prior Art*
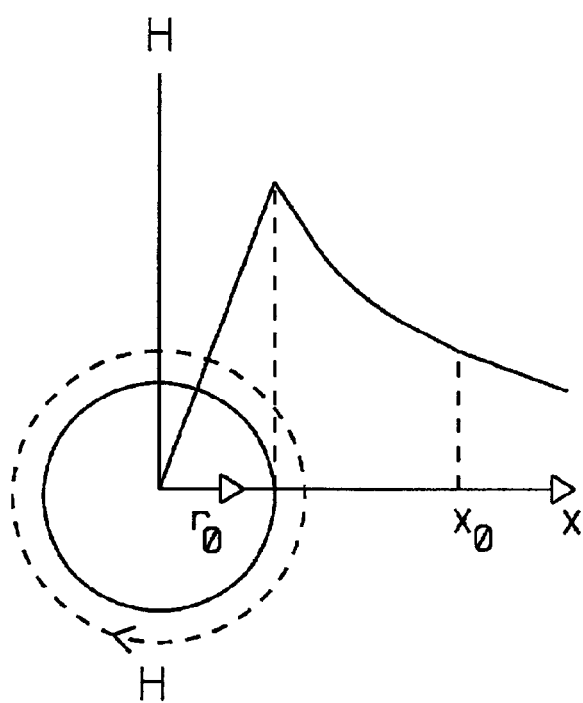
*FIG. 2a - Prior Art*

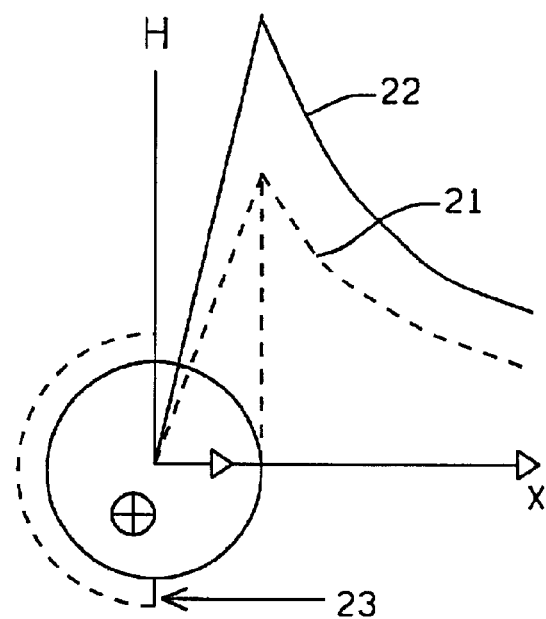
*FIG. 2b – Prior Art*
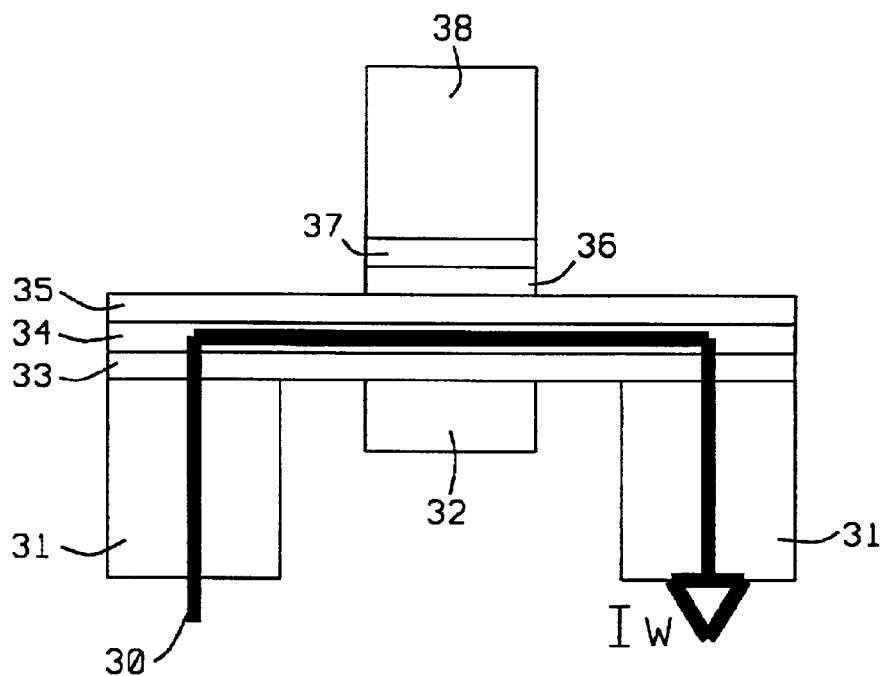
*FIG. 3*

HIGH PROGRAMMING EFFICIENCY MRAM CELL STRUCTURE

FIELD OF THE INVENTION

The invention relates to the general field of magnetic RAMs with particular reference to reducing current requirements for information writing.

BACKGROUND OF THE INVENTION

The principle governing the operation of the memory cells in magnetic RAMs is the change of resistivity of certain materials and film structures in the presence of a magnetic field (magneto-resistance).

The storage element used for the RAM of the present invention is a magnetic tunneling junction (MTJ) device. The MTJ device consists of a pair of soft ferromagnetic (FM) layers with an insulating spacer in between. The magnetization in one of the soft FM is free to rotate, and is called free layer. The magnetization of other FM layer is pinned by an adjacent anti-ferromagnetic (AF) layer and is called a pinned layer. The insulating layer, typically alumina or silica, is about 10 Angstroms thick. A tunneling current flows from one FM layer to another when voltage is applied across the two FM layers.

The principle governing the operation of the MTJ cell in magnetic RAMs is the change of resistivity of the tunnel junction between the two ferromagnetic layers. When the magnetizations of the two ferromagnetic layers are in opposite directions, the tunneling resistance increases, due to a reduction in the tunneling probability. Relative to the state in which the magnetization in the two FM films is in parallel, the difference in resistance is typically 40%. This phenomenon is called the tunnel magneto-resistance effect, or TMR.

In a conventional magnetic RAM, cells are programmed using two programming currents flowing through two orthogonal lines. This is illustrated in FIG. 1 where programming line 11 and bit line 12 intersect above memory cell 13. The applied magnetic field is in the longitudinal direction of the cell, due to lines 11, which is usually the magnetic anisotropy axis, but is below the switching threshold of the cells. Thus, the longitudinal field alone does not switch the cells. The transverse field generated by lines 12 lowers the switching threshold of the longitudinal field so that a cell that lies at the intersection of two orthogonally activated lines can switch, while half-selected cells on the same bit or programming line do not.

The weaknesses of this cell structure are twofold: (1) its flux generation efficiency from the program line is low, requiring a very large program current, in the order of 3–10 mA, to switch the cell and (2) the program field is not confined to the selected cell, all cells on the same program line seeing same magnetic field. This may cause a write disturb problem unless the tolerance of the switching threshold of the cells in the array is under tight control.

A routine search of the prior art was performed with the following references of interest being found:

In U.S. Pat. No. 6,211,090 B1, Durlam et al. show a magnetic memory device with high permeability material on the outside faces of each conductor to focus the flux toward the bit. The damascene structure that is used for the wiring greatly reduces the effectiveness of the flux concentrator layer as far as increasing the field right at the bit. Both U.S. Pat. No. 6,174,737 B1 (Durlan et al.) and U.S. Pat. No. 6,165,803 (Chen et al.) are similar to this and also show the same damascene structure for the wiring.

These patents teach how to make use of the second consideration, namely using high-permeability material to coat the program lines, to the cell structure given in prior art. There is no teaching of how to combine the two considerations to give a more efficient cell structure. This invention does.

In U.S. Pat. No. 6,272,040 B1, Salter et al. show a method for programming a MR memory device while Tran in, U.S. Pat. No. 6,163,477, shows an MRAM device that adds a permanent magnetic bias in addition to the regular switching fields. Zhu et al. describe a multi-layer MTJ memory cell in U.S. Pat. No. 5,978,257 while Tracy et al. (in U.S. Pat. No. 5,902,690) use a magnetic layer to shield the magnetic memory element from stray magnetic fields.

SUMMARY OF THE INVENTION

It has been an object of at least one embodiment of the present invention to provide a memory storage device, such as an MTJ structure, in which the magnetic flux generation efficiency is maximized so that the write current is minimized.

It is another objective of at least one embodiment of the present invention to provide a locally strong magnetic field in the vicinity of the selected memory storage element, such that it causes little interference to the neighboring cells.

These objects have been achieved using two methods. First, the program line is made to be part of the memory cell itself so the program current runs inside the device, instead of externally in a separate program line. This is the most efficient possible location for the program line since it is now only about 10 Angstrom from the free layer.

Since the pinned layer is located over the antiferromagnetic layer, part of the program current will flow through the latter as well (since this layer is generally electrically conducting—PtMn, IrMn or NiMn for example). This effect is, however, minor since the antiferromagnetic layer is relatively thin. If necessary, the program current could be fully confined to the pinned layer by making the antiferromagnetic layer electrically insulating, using NiO for example.

The flux at the free layer can be further increased by surrounding each bit and/or program line with a sheath of high permeability material which covers the full circumference of the wire except for a gap located directly above or below the memory element. This high permeability material reduces the magnetic field generated by the current in the surroundings, thereby increasing its strength at the gap. The high permeability layer may be confined to the immediate vicinity of the memory. The high permeability layer may be a conductor or an insulator, the latter case allowing it to make direct contact with the two ends of the memory stripe. dr

BRIEF DESCRIPTION OF THE DRAWINGS

FIG. 1 illustrates the structure of a magnetic tunnel junction device of the prior art.

FIG. 2a shows the magnitude of a magnetic field as a function of distance from the center of a circular current carrying conductor.

FIG. 2b shows the effect of adding a high-permeability material coating on part of the conductor.

FIG. 3 shows the essential elements of the present invention.

DESCRIPTION OF THE PREFERRED EMBODIMENTS

Figure 4A:
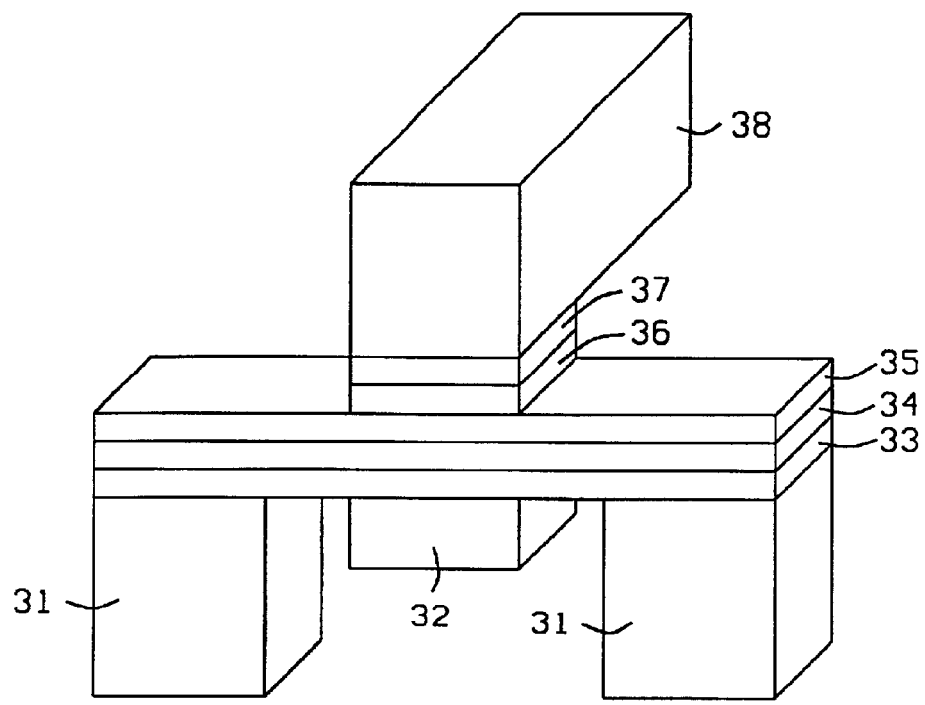
FIGS. 4a–4d are isometric representations of four embodiments of the present invention.

It is well known that the magnitude of the magnetic field generated by a current through a wire is position dependent. As illustrated in FIG. 2a, the magnitude of the magnetic field is zero at the center of a conductor, and increases to a maximum at the surface of the conductor then decreases with distance from the surface of the current conductor. Thus, the closer the program line to the free layer of the MTJ device, the more efficiently it provides the switching field.

The magnetic field generation efficiency can be increased many times by coating part of the current carrying conductor with high-permeability FM material. The magnetic field is very small inside the high permeability material and proportionately larger across the gap. As shown in FIG. 2b, with the high permeability material coating 23, the magnitude of the magnetic field measured at a point on the surface is further raised, from its intersection with curve 21 to its intersection with curve 22.

The above analysis was for a circular conductor, for the purpose of simplifying the mathematics, but similar flux behavior is found for current carrying conductors of rectangular and other cross-sections.

Thus, two methods can be applied to improve the flux generation efficiency of MRAM cell structure; (1) merge the cell and the programming line, (2) place high permeability material on part of the surface of programming line. Note that in the present context we define a high permeability material as one whose magnetic permeability is at least 10 although permeabilities much higher are readily obtained. For example, Permalloy ($Ni_{80}Fe_{20}$) films typically show permeability of 2,000–2,500.

Two of the novel features of the present invention are (1) to place the free layer of MTJ as close as possible to the programming line, implying that the programming current flows inside the MTJ (but not in the free layer, current in the free layer is not useful) and (2) to place a layer of high permeability material on the programming wire, leaving a gap on the side closest to the memory cell.

In the prior art, programming current flows in a separate line outside of the cell. This is less efficient. Thus, programming current flowing through the pinned layer is the most efficient way to switch the free layer. The distance between the free layer and the pinned layer is only about 10 Angstroms, far less than the distance between the program line and the free layer, as taught in the prior art.

The selected high permeability material should exhibit an anisotropy such that the material is not saturated during operation so that its flux delivery efficiency does not drop. The material may be electrically conducting or insulating. When it is insulating, it can be placed directly in contact with the memory cell, thereby giving it maximum efficiency. Note that high permeability material 32 is indeed in direct contact with layer 33 (FIGS. 4a–d) but it may not be in direct contact with 34 (the AF layer) even it is an insulator, since it could then be pinned by the AF layer and becomes magnetically hard, not soft. This point should become clearer as we proceed to the explanation of the layers of FIG. 4.

FIG. 3 shows the key features of the new cell structure, in which the program current 30 actually flows through the MTJ device on the pinned layer 35 side, together with a high permeability material coating 32. Suitable materials for layer 32 include, but are limited to supermalloy, NiFe, AlSiFe, CoFe, MnZn, CuZn, FeAlN, and FeO. Below the TMJ stack (free layer 37/insulator 36/pinned layer 35, there is an antiferromagnetic layer 34, a nonmagnetic base layer 33, and the high permeability layer 32.

Layer 33 connects two vias 31, the space between the inner edges of these vias being between about 0.3 and 5 microns wide while the stack itself is typically between about 0.1 and 3 microns wide, depending on the resolution of the imaging system. As shown in FIG. 3 the stack is positioned to be aligned with the high permeability layer but in other embodiments (see below) the latter may extend all the way across. Suitable materials for pinned layer 35 include, but are not limited to, NiFe, CoFe, NiFe/Ru/NiFe, CoFe/Ru/CoFe, and NiFe/Ru/CoFe. Its thickness is generally between about 10 and 100 Angstroms. The thickness of non-magnetic base layer 33 is typically between about 20 and 200 Angstroms, being chosen so that high permeability layer 32 does not get pinned so that it is left free to conduct flux. It shorts the lower half of the flux from the programming current.

Figure 4B:
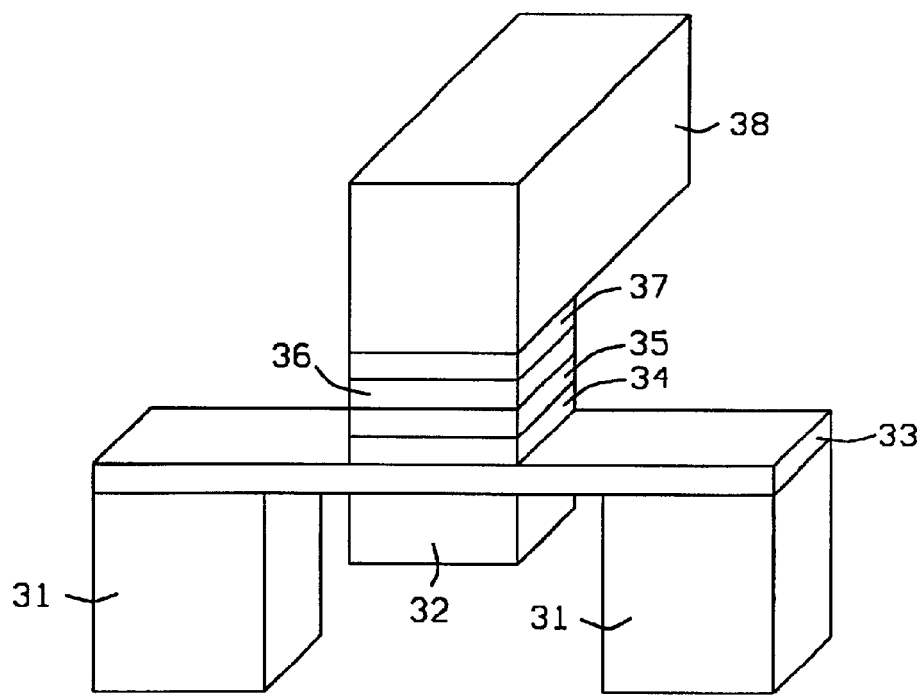

There are several variations on the basic cell structure of FIG. 3. These are illustrated in isometric projection in FIG. 4. FIGS. 4a and 4b show structures in which the high-permeability layer has approximately the same width as the MTJ device itself. In FIG. 4a he pinned layer 35 is longer than the cell, and extends to the vias 31. The programming current comes from a lower metal layer, passes through the via, then the cell, and then returns to a lower metal layer. In this arrangement, the demagnetization field from the edge of the pinned layer is far from the free layer so it does not affect the symmetry of the switch field.

The programming current may also come from an upper metal layer. In that case, the via connects the cell to upper level metal. For this structure, the AF layer under the pinned layer may be either electrically conducting or insulating. Since the pinned layer is connected to the via directly, the path of the programming current is not disrupted.

The pinned layer in FIG. 4b is patterned to the same size as free layer 37 and tunnel junction 36. The programming current flows through the base layer 33 and AF layer 34. These two cell structures can be applied to both conducting and insulating high permeability material, such as ferrite, since it hardly affects the flow of the programming current. For these two structures, the magnetic field is locally enhanced, right at the cell, so any disturbance of neighboring cells is minimal.

Figure 4C:
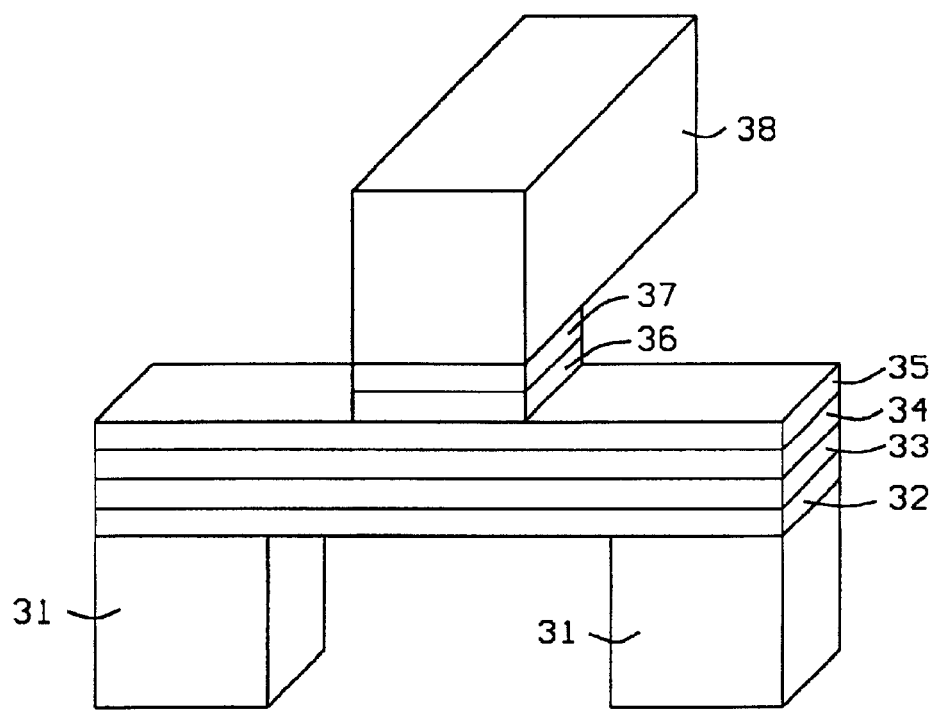
Figure 4D:
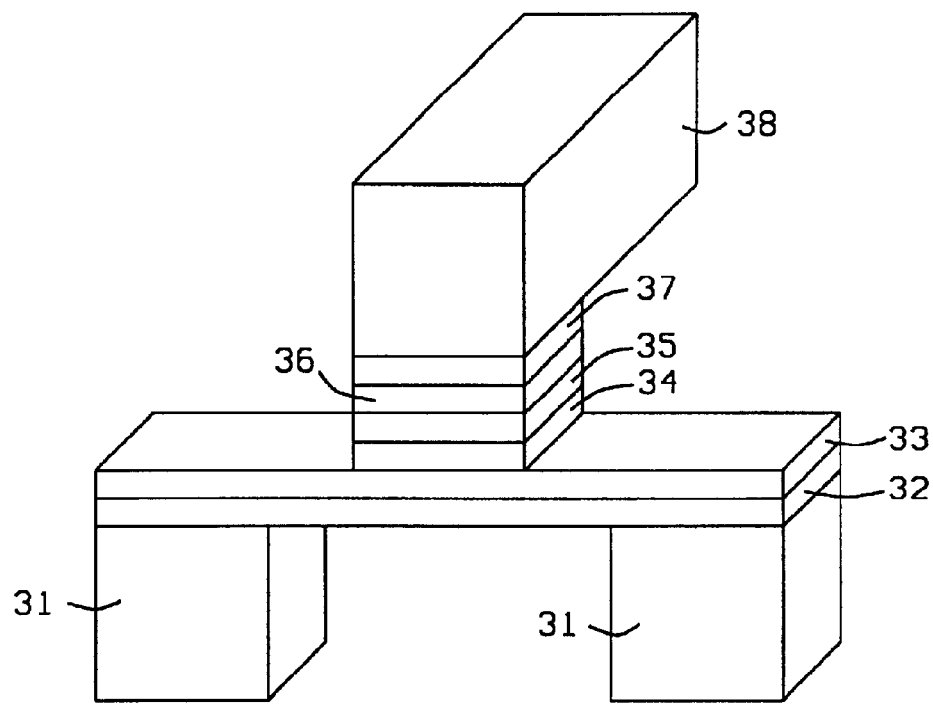

FIGS. 4c and 4d illustrate two other structures, in which the high permeability material 32, under base layer 33, extending al the way to the two vias 31. This structure is easier to build and requires one less feature patterning step. Unlike the structures shown in FIGS. 4a and 4b, high permeability layer 32 must be electrically conducting unless the programming current comes from upper layer metals. In such a case, the size of the tunnel insulator 36 may be either the same as the free layer 37 (as shown in FIGS. 4a–d) or extended to the vias, just like the pinned layer 35. It will not affect the programming efficiency.

What is claimed is:

1. A memory storage device comprising:
   an MTJ stack that includes a magnetically pinned layer;
   a program line, a portion of which is said pinned layer; and
   a layer of high magnetic permeability material located a distance below said pinned layer.

2. The memory storage device described in claim 1 wherein said layer of high magnetic permeability material has a permeability of at least 10.

3. The memory storage device described in claim 2 wherein said material is not saturated during operation as a memory storage device whereby its flux delivery efficiency does not drop.

4. The memory storage device described in claim 1 wherein said layer of high magnetic permeability material is selected from the group consisting of supermalloy, NiFe, AlSiFe, CoFe, MnZn, CuZn, FeAlN, and FeO.

5. The memory storage device described in claim 1 wherein said pinned layer is selected from the group consisting of NiFe, CoFe, NiFe/Ru/NiFe, CoFe/Ru/CoFe, and NiFe/Ru/CoFe.

6. The memory storage device described in claim 1 wherein said pinned layer has a thickness between about 10 and 100 Angstroms.

7. A memory device comprising:

a pair of conductive vias, having opposing inner and outer edges, separated from one another by a space between said inner edges;

on said vias, a layer of non-magnetic material contiguous to said outer edges and extending across said space;

below said layer of non-magnetic material, a high permeability layer located within said space between said inner edges, without touching said inner edges;

an antiferromagnetic layer on said non-magnetic layer;

a pinned layer on said antiferromagnetic layer;

a programming line, part of which is said pinned layer;

on said pinned layer, over said high permeability layer only, a tunnel insulator layer;

a free layer on said tunnel insulator layer; and a top electrode on said free layer.

8. The memory storage device described in claim 7 wherein said layer of high magnetic permeability material has a permeability of at least 10.

9. The memory storage device described in claim 8 wherein said material is not saturated during operation as a memory storage device whereby its flux delivery efficiency does not drop.

10. The memory storage device described in claim 7 wherein said layer of high magnetic permeability material is selected from the group consisting of supermalloy, NiFe, AlSiFe, CoFe, MnZn, CuZn, FeAlN, and FeO.

11. The memory storage device described in claim 7 wherein said pinned layer is selected from the group consisting of NiFe, CoFe, NiFe/Ru/NiFe, CoFe/Ru/CoFe, and NiFe/Ru/CoFe.

12. The memory storage device described in claim 7 wherein said pinned layer has a thickness between about 10 and 100 Angstroms.

13. The memory storage device described in claim 7 wherein said space between said inner edges is between about 0.3 and 5 microns wide.

14. A memory storage device comprising:

a pair of conductive vias, having opposing inner and outer edges, separated from one another by a space between said inner edges;

on said vias, a layer of non-magnetic material contiguous to said outer edges and extending across said space, said non-magnetic layer being part of a programming line;

below said layer of non-magnetic material, a high permeability layer located within said space between said inner edges, without touching said inner edges;

an antiferromagnetic layer, over said high permeability layer only, on said non-magnetic layer;

a pinned layer on said antiferromagnetic layer;

on said pinned layer a tunnel insulator layer;

a free layer on said tunnel insulator layer; and a top electrode on said free layer.

15. The memory storage device described in claim 14 wherein said layer of high magnetic permeability material has a permeability of at least 10.

16. The memory storage device described in claim 15 wherein said material is not saturated during operation as a memory storage device whereby its flux delivery efficiency does not drop.

17. The memory storage device described in claim 14 wherein said layer of high magnetic permeability material is selected from the group consisting of supermalloy, NiFe, AlSiFe, CoFe, MnZn, CuZn, FeAlN, and FeO.

18. The memory storage device described in claim 14 wherein said pinned layer is selected from the group consisting of NiFe, CoFe, NiFe/Ru/NiFe, CoFe/Ru/CoFe, and NiFe/Ru/CoFe.

19. The memory storage device described in claim 14 wherein said pinned layer has a thickness between about 10 and 100 Angstroms.

20. The memory storage device described in claim 14 wherein said space between said inner edges is between about 0.3 and 5 microns wide.

21. A memory storage device comprising:

a pair of conductive vias, having opposing inner and outer edges, separated from one another by a space between said inner edges;

on said vias, a layer of high magnetic permeability material contiguous to said outer edges and extending across said space;

on said high permeability layer, a layer of non-magnetic material;

an antiferromagnetic layer on said non-magnetic layer;

a pinned layer on said antiferromagnetic layer, said pinned layer being part of a programming line;

on said pinned layer, a tunnel insulator layer located only over an area that is within said space and having no overlap with said inner edges;

a free layer on said tunnel insulator layer; and a top electrode on said free layer.

22. The memory storage device described in claim 21 wherein said layer of high magnetic permeability material has a permeability of at least 10.

23. The memory storage device described in claim 22 wherein said material is not saturated during operation as a memory storage device whereby its flux delivery efficiency does not drop.

24. The memory storage device described in claim 21 wherein said layer of high magnetic permeability material is selected from the group consisting of supermalloy, NiFe, AlSiFe, CoFe, MnZn, CuZn, FeAlN, and FeO.

25. The memory storage device described in claim 21 wherein said pinned layer is selected from the group consisting of NiFe, CoFe, NiFe/Ru/NiFe, CoFe/Ru/CoFe, and NiFe/Ru/CoFe.

26. The memory storage device described in claim 21 wherein said pinned layer has a thickness between about 10 and 100 Angstroms.

27. The memory storage device described in claim 21 wherein said space between said inner edges is between about 0.1 and 3 microns wide.

28. A MTJ device comprising:

a pair of conductive vias, having opposing inner and outer edges, separated from one another by a space between said inner edges;

on said vias, a layer of high magnetic permeability material contiguous to said outer edges and extending across said space;

a layer of non-magnetic material on said high permeability layer;

on said non-magnetic layer, an antiferromagnetic layer located only over an area that is within said space and having no overlap with said inner edges;

a pinned layer on said antiferromagnetic layer, said pinned layer being part of a programming line;

on said pinned layer, a tunnel insulator layer;

a free layer on said tunnel insulator layer; and a top electrode on said free layer.

29. The memory storage device described in claim 28 wherein said layer of high magnetic permeability material has a permeability of at least 10.

30. The memory storage device described in claim 29 wherein said material is not saturated during operation as a memory storage device whereby its flux delivery efficiency does not drop.

31. The memory storage device described in claim 28 wherein said layer of high magnetic permeability material is selected from the group consisting of supermalloy, NiFe, AlSiFe, CoFe, MnZn, CuZn, FeAlN, and FeO.

32. The memory storage device described in claim 28 wherein said pinned layer is selected from the group consisting of NiFe, CoFe, NiFe/Ru/NiFe, CoFe/Ru/CoFe, and NiFe/Ru/CoFe.

33. The memory storage device described in claim 28 wherein said pinned layer has a thickness between about 10 and 100 Angstroms.

34. The memory storage device described in claim 28 wherein said space between said inner edges is between about 0.1 and 5 microns wide.

* * * * *